(12) United States Patent
Wang et al.

(10) Patent No.: US 11,657,947 B2
(45) Date of Patent: May 23, 2023

(54) SWITCHING POWER SUPPLY MODULE AND PACKAGING METHOD THEREOF

(71) Applicant: Shenzhen Sunlord Electronics Co., Ltd., Guangdong (CN)

(72) Inventors: Wenjie Wang, Guangdong (CN); Dafu Lu, Guangdong (CN)

(73) Assignee: Shenzhen Sunlord Electronics Co., Ltd., Guangdong (CN)

( * ) Notice: Subject to any disclaimer, the term of this patent is extended or adjusted under 35 U.S.C. 154(b) by 451 days.

(21) Appl. No.: 15/931,609

(22) Filed: May 14, 2020

(65) Prior Publication Data

US 2020/0273616 A1 Aug. 27, 2020

Related U.S. Application Data

(63) Continuation of application No. PCT/CN2018/086094, filed on May 9, 2018.

(30) Foreign Application Priority Data

Nov. 20, 2017 (CN) .......................... 201711161014.1

(51) Int. Cl.
| | |
|---|---|
| H01F 27/28 | (2006.01) |
| H01F 27/24 | (2006.01) |
| H01F 27/29 | (2006.01) |
| H01L 23/495 | (2006.01) |
| H01L 23/00 | (2006.01) |

(Continued)

(52) U.S. Cl.
CPC ........... *H01F 27/24* (2013.01); *H01F 27/292* (2013.01); *H01F 41/0233* (2013.01); *H01L 23/495* (2013.01); *H01L 24/48* (2013.01); *H01L 24/73* (2013.01); *H01L 25/16* (2013.01);

(Continued)

(58) Field of Classification Search
USPC ................................ 336/233, 221, 232, 200
See application file for complete search history.

(56) References Cited

U.S. PATENT DOCUMENTS

| | | | |
|---|---|---|---|
| 2012/0044656 A1* | 2/2012 | Lu ........................ | H01L 23/3121 361/748 |
| 2014/0009254 A1* | 1/2014 | Ohkubo .............. | H01F 17/0033 336/192 |
| 2015/0061811 A1* | 3/2015 | Takagi .................. | H01F 27/292 336/192 |

FOREIGN PATENT DOCUMENTS

| | | |
|---|---|---|
| CN | 102376594 | 3/2012 |
| CN | 102592781 | 7/2012 |

(Continued)

*Primary Examiner* — Shawki S Ismail
*Assistant Examiner* — Kazi S Hossain
(74) *Attorney, Agent, or Firm* — Winston Hsu

(57) ABSTRACT

A switching power supply module includes a power inductor which includes a magnetic core and L-shaped metal end electrodes and a switching power supply chip which includes a packaging body, a bare chip and a bottom bonding pad of the bare chip; the L-shaped metal end electrode includes a first electrode part which is welded at 90° to the magnetic core and a second electrode part which extends in parallel from the first electrode part to the middle of the magnetic core and is perpendicular to the first electrode part; the bare chip and the packaging body are embedded between the first, the second electrode part and the magnetic core; the bottom bonding pad abuts between the two second electrode parts and is insulated from the second electrode part, and the weld face of the bottom bonding pad is flush with that of the second electrode part.

7 Claims, 4 Drawing Sheets

(51) Int. Cl.
*H01L 25/16* (2023.01)
*H01F 41/02* (2006.01)

(52) U.S. Cl.
CPC ............... *H01L 2224/48463* (2013.01); *H01L 2924/30107* (2013.01)

(56) References Cited

FOREIGN PATENT DOCUMENTS

| CN | 103000608 | 3/2013 |
| CN | 203644518 | 6/2014 |

\* cited by examiner

SWITCHING POWER SUPPLY MODULE AND PACKAGING METHOD THEREOF

CROSS REFERENCE TO RELATED APPLICATIONS

This application is a continuation application of PCT/CN2018/086094, filed on May 9, 2018, which claims priority of China patent application CN201711161014.1 filed on Nov. 20, 2017. The contents of PCT/CN2018/086094 and CN201711161014.1 are all hereby incorporated by reference.

BACKGROUND OF THE INVENTION

1. Field of the Invention

The application relates to a switching power supply module and an integrated packaging method thereof.

2. Description of the Related Art

The switching power supply has the advantages of small volume and high power density. With the popularization of portable electronic equipment such as smart phones, motion cameras, Bluetooth earphones and the like, it has rapid development. In order to meet the market trend of lightness and thinness, the smaller size and higher power density of the switching power supply are constantly pursued by the industry.

At present, most of the packaging methods of the switching power supply module belong to discrete packaging, namely peripheral components such as a DC-DC chip and an inductor are respectively welded at different positions of a bonding pad and then packaged together. Due to the fact that the size of the power inductor is generally large, the overall packaging area is large, and thus the overall power density of the switching power supply module is reduced.

The disclosure of the above background is only used for assisting in understanding the inventive concept and technical solution of the present application, and does not necessarily belong to the prior art of the present patent application. Insofar as there is no explicit evidence that the above-mentioned contents have been disclosed on the filing date of the present patent application, the above-mentioned background art should not be used for evaluating the novelty and inventive step of the present application.

SUMMARY OF THE INVENTION

The application mainly aims to provide an integrally packaged switching power supply module so as to obtain smaller packaging volume and higher power density.

In order to achieve the above object, one embodiment of the application provides the following technical solution.

A switching power supply module comprises a power inductor and a switching power supply chip, wherein the power inductor comprises a magnetic core and L-shaped metal end electrodes welded at two ends of the magnetic core, and the switching power supply chip comprises a packaging body, a bare chip in the packaging body and a bottom bonding pad of the bare chip; the L-shaped metal end electrode comprises a first electrode part and a second electrode part which are perpendicular to each other, the first electrode part is welded to the magnetic core and at a right angle to the magnetic core, and the second electrode part extends in parallel from the first electrode part to the middle of the magnetic core; the bare chip and the packaging body thereof are together embedded between the first electrode part, the second electrode part and the magnetic core; meanwhile, the bottom bonding pad abuts between the two second electrode parts and is insulated from the second electrode part, and the weld face of the bottom bonding pad is flush with the weld face of the second electrode part.

Compared with the existing discrete packaging module, the integrally packaged switching power supply module provided by the application has the following beneficial effects: the inductor is arranged above the chip, and the chip is nested in the gap between the magnetic core and the end electrode of the power inductor, so that the volume occupied by the whole module on the PCB is almost the same as the volume occupied by a single power inductor, and the volume is much smaller and the power density is much higher compared with a discretely packaged module with the same size of inductor and chip. In other words, an inductor with a larger size can be selected on the premise of keeping the total volume of the module unchanged, and electrical properties such as the inductance amount and rated current of the corresponding inductor can be better. Although the thickness is sacrificed, the increment of the length and width dimension is enough to compensate for the performance loss caused by reduction of the thickness, and there is even surplus. Therefore, higher power of supply is provided on the premise that the total volume of the module is unchanged.

The application also provides a packaging method for the switching power supply module, which comprises the steps of:

providing a magnetic core of a patch-type inductor, two identical L-shaped metal electrode sheets and a switching power supply chip, wherein the L-shaped metal electrode sheet comprises a first electrode part and a second electrode part which are perpendicular to each other, and the switching power supply chip comprises a packaging body, a bare chip in the packaging body and a bottom bonding pad of the bare chip;

respectively welding the two L-shaped electrode sheets to the two ends of the magnetic core, welding the first electrode part and the end part of the magnetic core during the welding to enable the first electrode part is at a right angle to the magnetic core, and simultaneously extending in parallel the second electrode part from the first electrode part to a middle direction of the magnetic core to obtain the power inductor with the L-shaped metal end electrode; and mutually nesting the switching power supply chip with the power inductor, so that the bare chip and the packaging body thereof are together embedded between the first electrode part, the second electrode part and the magnetic core; meanwhile, the bottom bonding pad abuts between the two second electrode parts and is insulated from the second electrode part, and the weld face of the bottom bonding pad is flush with the weld face of the second electrode part.

These and other objectives of the present invention will no doubt become obvious to those of ordinary skill in the art after reading the following detailed description of the preferred embodiment that is illustrated in the various figures and drawings.

DETAILED DESCRIPTION

The present application will now be further described with reference to the accompanying drawings and specific implementations.

Figure 1:
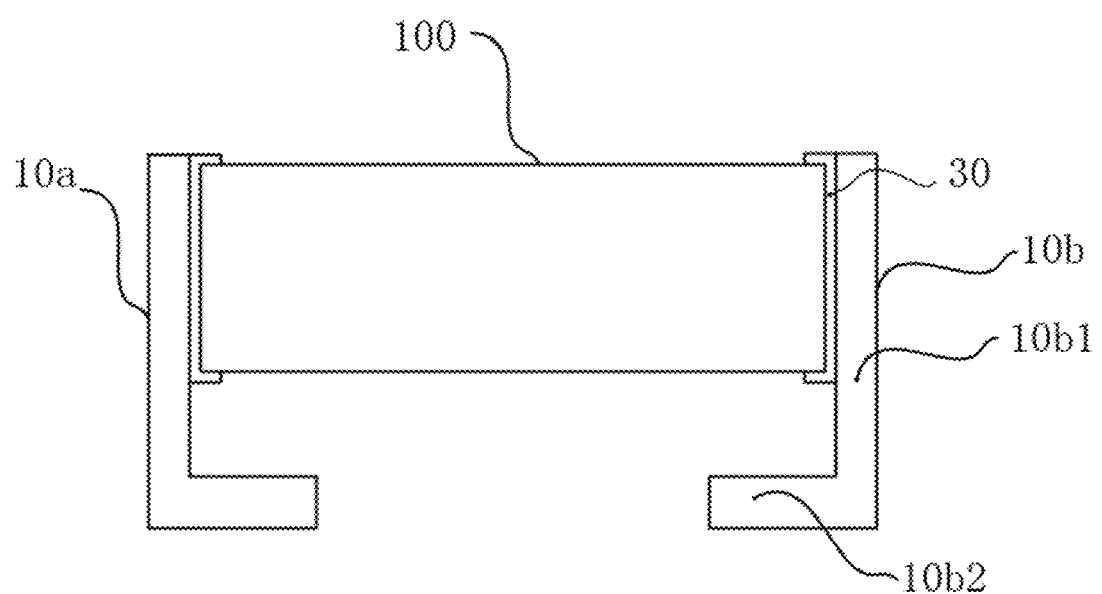
FIG. 1 is a schematic diagram of a power inductor for integrally packaging a switching power supply module.
Figure 2:
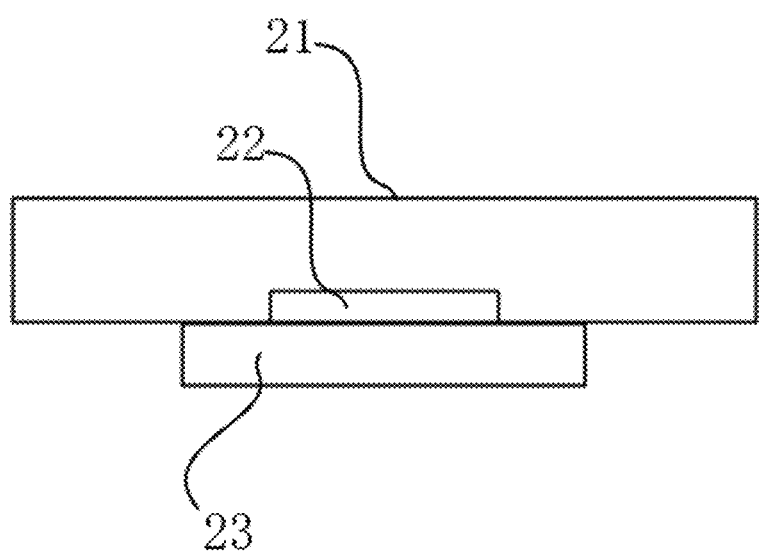
FIG. 2 is a schematic diagram of a switching power supply chip of an integrally packaged switching power supply module.
Figure 3:
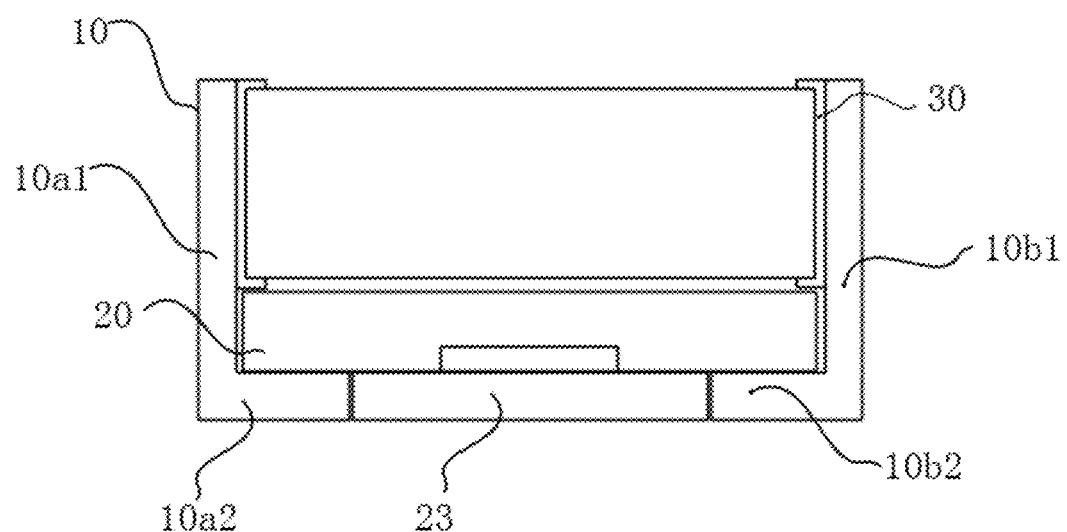
FIG. 3 is a schematic diagram of an integrated switching power supply module formed by nesting and packaging the power inductor of FIG. 1 and the switching power supply chip of FIG. 2.

The specific implementations of the application provides an integrally packaged switching power supply module which comprises a power inductor 10 and a switching power supply chip 20 as shown in FIG. 3. As shown in FIG. 1, the power inductor 10 comprises a magnetic core 100 and L-shaped metal end electrodes 10a and 10b welded at two ends of the magnetic core 100; as shown in FIG. 2, the switching power supply chip 20 includes a packaging body 21, a bare chip 22 in the packaging body, and a bottom bonding pad 23 of the bare chip. The two L-shaped metal end electrodes are identical, and one of them is illustrated as an example. The L-shaped metal end electrode 10b comprises a first electrode part 10b1 and a second electrode part 10b2 which are perpendicular to each other, the first electrode part 10b1 is welded to one end of the magnetic core 100, the first electrode part 10b1 is at a right angle to the magnetic core 100, and the second electrode part 10b2 extends in parallel from the first electrode part toward the middle of the magnetic core 100. The bare chip 22 and the packaging body 21 thereof are together embedded between the first electrode part, the second electrode part and the magnetic core; meanwhile, the bottom bonding pad 23 abuts between two second electrode parts 10a2 and 10b2 and is insulated from the second electrode part, and the weld face of the bottom bonding pad 23 is flush with the weld face of the second electrode part.

In a specific embodiment, the magnetic core of the power inductor is cubical and may be considered a magnetic core in a patch-type inductor, which may take the form of a metric 2520 size, i.e. a thickness of 0.5 mm. In addition, the L-shaped metal end electrode of the power inductor can adopt a copper sheet with a thickness of 0.2-0.25 mm; and the size of the bare chip may be 2.0*2.0*0.3 mm. The sizes herein are by way of example only, and it is to be understood that the sizes are not to be construed as limiting the application.

In a preferred embodiment, the packaging body of the bare chip may be a resin packaging body of which outer shape profile is adapted to a gap defined between the L-shaped metal end electrode and the magnetic core, so that the packaging body 21 in which the bare chip is located can just be placed in the gap. In addition, a welding auxiliary structure is provided at a welding position of the first electrode part and the magnetic core, such as a sunken portion, i.e. a recess which is not too deep. The shape of the welding auxiliary structures is not limited, and certain solder can be received in the auxiliary structure during welding, so that the welding between the end parts of the magnetic core and the first electrode part can be firmer. A welding layer between the two ends of the magnetic core and the L-shaped metal end electrode is a nickel layer 30. The bare chip 22 and the bottom pad 23 have been connected by bond wires.

Figure 4:
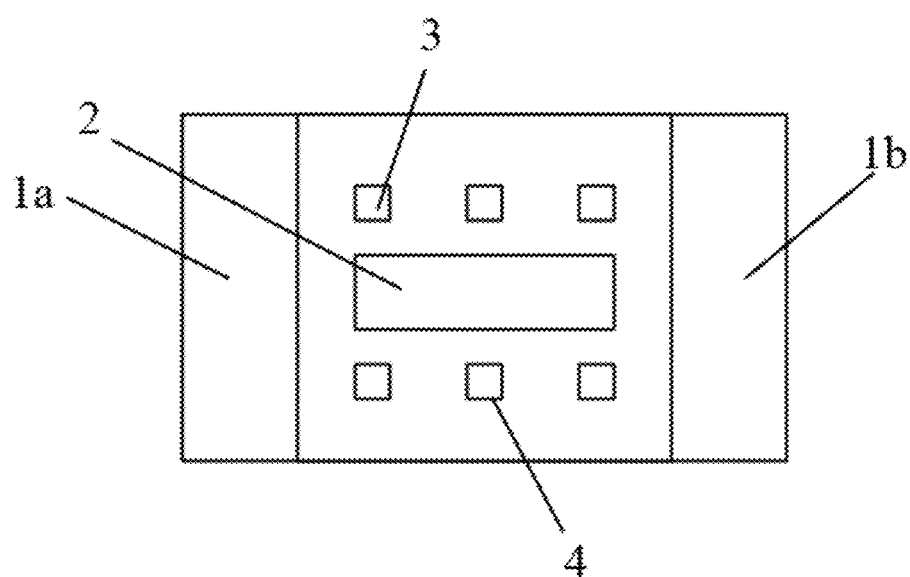
FIG. 4 is a schematic view of a bottom weld face of the switching power supply module shown in FIG. 3.

Another embodiment of the application provides a packaging method for the switching power supply module, which comprises the steps of:

firstly, providing a magnetic core of a patch-type inductor, two identical L-shaped metal electrode sheets and a switching power supply chip, wherein the L-shaped metal electrode sheet comprises a first electrode part and a second electrode part which are perpendicular to each other, and the switching power supply chip comprises a packaging body, a bare chip in the packaging body and a bottom bonding pad of the bare chip;

secondly, respectively welding the two L-shaped electrode sheets to the two ends of the magnetic core, welding the first electrode part and the end part of the magnetic core during the welding to enable the first electrode part is at a right angle to the magnetic core, and simultaneously extending in parallel the second electrode part from the first electrode part to a middle direction of the magnetic core to obtain the power inductor with the L-shaped metal end electrode; and finally, mutually nesting the switching power supply chip with the power inductor, so that the bare chip and the packaging body thereof are together embedded between the first electrode part, the second electrode part and the magnetic core; meanwhile, the bottom bonding pad abuts between the two second electrode parts and is insulated from the second electrode part, and the weld face of the bottom bonding pad is flush with the weld face of the second electrode part. As shown in FIG. 4, it is the bottom of the packaged switching power supply module. The weld faces 1a, 1b of the second electrode part and a plurality of welding point positions 2, 3, 4 and the like of the bottom bonding pad of the chip can be seen.

The foregoing is a further detailed description of the application, taken in conjunction with specific preferred embodiments, and is not to be construed as limiting the application to those specific embodiments. It will be apparent to those skilled in the art that various equivalents and modifications can be made without departing from the spirit and scope of the application, and have the same performance or use, which shall be deemed to belong to the protection scope of the application.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switching power supply module, comprising a power inductor and a switching power supply chip, wherein the power inductor comprises a magnetic core and L-shaped metal end electrodes welded at two ends of the magnetic core, and the switching power supply chip comprises a packaging body, a bare chip in the packaging body, and a bottom bonding pad of the bare chip;

the L-shaped metal end electrode comprises a first electrode part and a second electrode part which are perpendicular to each other, the first electrode part is welded to the magnetic core and at a right angle to the magnetic core, and the second electrode part extends in parallel from the first electrode part to the middle of the magnetic core; and the bare chip and the packaging body thereof are together embedded between the first electrode part, the second electrode part and the magnetic core; meanwhile, the bottom bonding pad abuts between two second electrode parts and is insulated from the second electrode part, and the weld face of the bottom bonding pad is flush with the weld face of the second electrode part;

wherein the packaging body of the bare chip is a resin packaging body, and the outline of the outer shape of the packaging body is matched with a gap formed between the L-shaped metal end electrode and the magnetic core.

2. The switching power supply module of claim 1, wherein and a welding auxiliary structure is provided at a welding position of the first electrode part and the magnetic core.

3. The switching power supply module of claim 2, wherein the welding auxiliary structure includes a recess that can receive solder.

4. The switching power supply module of claim 1, wherein a welding layer between the two ends of the magnetic core and the L-shaped metal end electrode is a nickel layer.

5. The switching power supply module of claim 1, wherein the magnetic core of the power inductor is cubic.

6. The switching power supply module of claim 1, wherein the bare chip and the bottom bonding pad the bare chip are connected via bond wires.

7. A packaging method for the switching power supply module of claim 1, comprising the steps of:

providing a magnetic core of a patch-type inductor, two identical L-shaped metal electrode sheets and a switching power supply chip, wherein the L-shaped metal electrode sheet comprises a first electrode part and a second electrode part which are perpendicular to each other, and the switching power supply chip comprises a packaging body, a bare chip in the packaging body and a bottom bonding pad of the bare chip;

respectively welding the two L-shaped electrode sheets to the two ends of the magnetic core, welding the first electrode part and the end part of the magnetic core during the welding to enable the first electrode part is at a right angle to the magnetic core, and simultaneously extending in parallel the second electrode part from the first electrode part to a middle direction of the magnetic core to obtain the power inductor with the L-shaped metal end electrode; and mutually nesting the switching power supply chip with the power inductor, so that the bare chip and the packaging body thereof are together embedded between the first electrode part, the second electrode part and the magnetic core; meanwhile, the bottom bonding pad abuts between the two second electrode parts and is insulated from the second electrode part, and the weld face of the bottom bonding pad is flush with the weld face of the second electrode part.

* * * * *